United States Patent
Zhang et al.

(10) Patent No.: US 11,744,030 B2
(45) Date of Patent: Aug. 29, 2023

(54) HINGE STRUCTURE AND FOLDABLE ELECTRONIC DEVICE

(71) Applicant: Beijing Xiaomi Mobile Software Co., Ltd., Beijing (CN)

(72) Inventors: Xuehu Zhang, Beijing (CN); Lianjia Zhao, Beijing (CN); Zhengquan Wang, Beijing (CN); Hongwei Jin, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 401 days.

(21) Appl. No.: 16/915,374

(22) Filed: Jun. 29, 2020

(65) Prior Publication Data
US 2021/0267076 A1    Aug. 26, 2021

(30) Foreign Application Priority Data
Feb. 20, 2020    (CN) .......................... 202010104987.7

(51) Int. Cl.
*H05K 5/02* (2006.01)
*E05D 3/12* (2006.01)
(Continued)

(52) U.S. Cl.
CPC .......... *H05K 5/0226* (2013.01); *E05D 3/122* (2013.01); *E05D 3/18* (2013.01); *E05D 11/1014* (2013.01);
(Continued)

(58) Field of Classification Search
CPC ......... E05Y 2900/606; E05Y 2201/462; E05Y 2201/218; F16C 11/10; F16C 11/04;
(Continued)

(56) References Cited

U.S. PATENT DOCUMENTS 9,983,637 B1 *  5/2018  Morrison .............. G06F 1/1647
10,798,836 B2 * 10/2020  Manuel .................... E05D 7/00
(Continued)

FOREIGN PATENT DOCUMENTS

CN        207018340 U       2/2018
CN        110225158 A       9/2019
(Continued)

OTHER PUBLICATIONS

Supplementary European Search Report in European Application No. 20188499.6, dated Jan. 27, 2021.
(Continued)

*Primary Examiner* — Victor D Batson
*Assistant Examiner* — Matthew J Sullivan
(74) *Attorney, Agent, or Firm* — Finnegan, Henderson, Farabow, Garrett & Dunner, L.L.P.

(57) ABSTRACT

A hinge structure includes: a supporting sheet having an unfolded, flattened state and a folded state; at least one first hinge connected to the supporting sheet, the at least one first hinge being configured to drive the supporting sheet to switch between the unfolded, flattened state and the folded state; at least one flattening support including a first support, a second support, and a flattening bracket, the flattening bracket being connected to the first support and the second support, the flattening bracket being connected to the supporting sheet. When the supporting sheet is in the unfolded, flattened state, the first support and the second support interact with each other and generate a force parallel to a plane where the supporting sheet is located, to maintain the supporting sheet in the unfolded, flattened state.

17 Claims, 16 Drawing Sheets

(51) Int. Cl.
  *E05D 3/18* (2006.01)
  *E05D 11/10* (2006.01)
  *F16C 11/04* (2006.01)
  *F16C 11/10* (2006.01)
  *H04M 1/02* (2006.01)

(52) U.S. Cl.
  CPC .............. *F16C 11/04* (2013.01); *F16C 11/10* (2013.01); *E05Y 2201/218* (2013.01); *E05Y 2201/462* (2013.01); *E05Y 2900/606* (2013.01); *H04M 1/0268* (2013.01)

(58) Field of Classification Search
  CPC ....... E05D 11/1014; E05D 3/18; E05D 3/122; H05K 5/0226
  See application file for complete search history.

(56) References Cited

U.S. PATENT DOCUMENTS

| | | | |
|---|---|---|---|
| 11,256,302 B2* | 2/2022 | Holung | ................ G06F 1/1681 |
| 2016/0284497 A1 | 9/2016 | Stryker | |
| 2017/0145725 A1* | 5/2017 | Siddiqui | ............... G06F 1/1641 |
| 2017/0300087 A1 | 10/2017 | Stryker | |
| 2018/0343756 A1 | 11/2018 | Lin et al. | |
| 2019/0033917 A1 | 1/2019 | Stryker | |
| 2019/0274227 A1 | 9/2019 | Hsu et al. | |
| 2019/0394894 A1 | 12/2019 | Kim | |
| 2020/0267858 A1* | 8/2020 | Kim | ........................ F16C 11/04 |
| 2021/0397226 A1* | 12/2021 | Siddiqui | ............... G06F 1/1652 |
| 2021/0405711 A1* | 12/2021 | Morrison | ................... F16H 3/30 |
| 2022/0100238 A1* | 3/2022 | Siddiqui | ............... G06F 1/1681 |
| 2022/0100239 A1* | 3/2022 | Siddiqui | ............... G06F 1/1618 |

FOREIGN PATENT DOCUMENTS

| | | |
|---|---|---|
| JP | 2014103631 A | 6/2014 |
| KR | 20200000059 A | 1/2020 |
| WO | WO 2014080684 A1 | 5/2014 |
| WO | WO 2017/087343 A1 | 5/2017 |

OTHER PUBLICATIONS

Notification of Reason for Refusal for Korean Application No. 10-2020-0087342, dated Mar. 18, 2022.
Notice of Reasons for Refusal of Japanese Application No. 2020-119764, dated Sep. 2, 2021.

* cited by examiner

HINGE STRUCTURE AND FOLDABLE ELECTRONIC DEVICE

CROSS-REFERENCE TO RELATED APPLICATIONS

This application is based upon and claims priority to Chinese Patent Application No. 202010104987.7, filed on Feb. 20, 2020, the entire contents of which are incorporated herein by reference.

TECHNICAL FIELD

The present disclosure relates to the field of terminal technology, and more particularly, to a hinge structure and a foldable electronic device.

BACKGROUND

With the development of flexible organic light-emitting diode (OLED) display technology, as well as foldable electronic devices have the portability of ordinary electronic devices and provide great experience of large-screen display after deployment, the foldable electronic devices have gradually become an important trend in the development of mobile terminals.

SUMMARY

According to a first aspect of embodiments of the present disclosure, a hinge structure includes: a supporting sheet having an unfolded, flattened state and a folded state; at least one first hinge connected to the supporting sheet, the at least one first hinge being configured to drive the supporting sheet to switch between the unfolded, flattened state and the folded state; at least one flattening support including a first support, a second support, and a flattening bracket, the flattening bracket being connected to the first support and the second support, and the flattening bracket being connected to the supporting sheet, wherein when the supporting sheet is in the unfolded, flattened state, the first support and the second support interact with each other and generate a force parallel to a plane where the supporting sheet is located, to maintain the supporting sheet in the unfolded, flattened state.

According to a second aspect of the embodiments of the present disclosure, a foldable electronic device includes: the hinge structure according to the first aspect; and a middle frame, the middle frame being connected to the supporting sheet of the hinge structure, to switch a state of the middle frame in accordance with a switch of the state of the supporting sheet.

It should be understood that the above general description and the following detailed description are only exemplary and explanatory, and do not limit the present disclosure.

BRIEF DESCRIPTION OF THE DRAWINGS

The accompanying drawings, which are incorporated in and constitute a part of this specification, illustrate embodiments consistent with the present disclosure and, together with this specification, serve to explain the principles of the present disclosure.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the present disclosure. Instead, they are merely examples of devices and methods consistent with some aspects of the present disclosure as detailed in the appended claims.

Terms used in the present disclosure are merely for the purpose of describing exemplary embodiments and are not intended to limit the present disclosure. For example, although the terms "first," "second," "third," etc. may be used to describe various information in the present disclosure, the information should not be limited to these terms. These terms are only used to distinguish the same type of information from each other. For example, first information may also be referred to as second information. Similarly, second information may also be referred to as first information without departing from the scope of the present disclosure.

Figure 1:
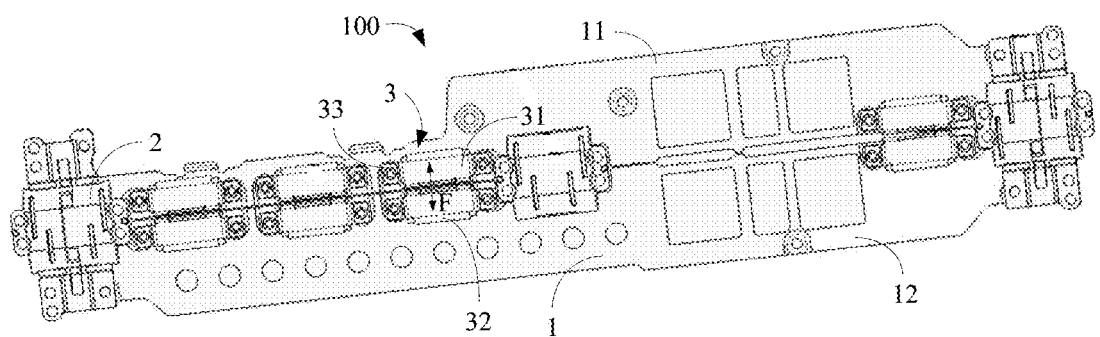
FIG. 1 is a schematic diagram of a hinge structure according to some embodiments of the disclosure.

FIG. 1 is a schematic diagram of a hinge structure 100 according to some embodiments of the disclosure. As shown in FIG. 1, the hinge structure 100 includes a supporting sheet 1 and at least one first hinge 2. The supporting sheet 1 may have a folded state and an unfolded, flattened state. Fox example, the supporting sheet 1 may be switched from the unfolded, flattened state to the folded state. Two edges disposed opposite to each other on both sides of the supporting sheet 1 in the folded state form an angle greater than 0° and less than 180°. The supporting sheet 1 may also be switched from the folded state to the unfolded, flattened state. When the supporting sheet 1 is connected to a middle frame of an electronic device equipped with the hinge structure 100, a state of the middle frame of the electronic device can be switched, thereby driving the electronic device to switch between the unfolded, flattened state and the folded state. The supporting sheet 1 may be made of a rigid material, and the supporting sheet 1 may include two pieces rotatable relative to each other to achieve a switch of the state. The supporting sheet 1 may also be made of a metal memory material, so that the state of supporting sheet 1 may be switch under the effect of an external force, and in the absence of a force, the supporting sheet 1 may be maintained in the current state.

The supporting sheet 1 may also be connected to each of the at least one first hinge 2 to drive the supporting sheet 1 to switch the state by the first hinge 2. For example, the supporting sheet 1 may be switched from the unfolded, flattened state to the folded state or switched from the folded state to the unfolded, flattened state by the at least one first hinge 2. In some embodiments, in order to maintain the supporting sheet 1 in the unfolded, flattened state, the hinge structure 100 may also include at least one set of flattening supports 3. As shown in FIG. 1, each set of flattening supports 3 may include a first support 31, a second support 32 and a flattening bracket 33. The flattening bracket 33 is connected to the first support 31 and the second support 32, and the flattening bracket 33 is also connected to the supporting sheet 1. When the supporting sheet 1 is in the unfolded, flattened state, the first support 31 and the second support 32 may interact with each other and generate a force parallel to a plane where the supporting sheet 1 is located (as indicated in FIG. 1 by a force F), to maintain the supporting sheet 1 in the unfolded, flattened state.

In the embodiment, the number of the first hinges 2 and of the flattening supports 3 is not limited, and may be designed as needed. For example, in the embodiment shown in FIG. 1, the hinge structure includes two first hinges 2 located at the ends of the hinge structure 100 and four flattening supports 3 located between the two first hinges 2. In other embodiments, the number of the flattening supports 3 may be designed according to the force required for maintaining the supporting sheet 1 and the force that each set of flattening supports 3 can provide. For example, the number of the flattening supports 3 may also be three, five or more, which is not limited in the present disclosure. Similarly, the number of the first hinges 2 may also be selected according to a length of the hinge structure 100. In an embodiment, three first hinges 2 may be provided to evenly distribute along the length of the hinge structure 100. This is only for illustrative purposes, and another number of first hinges 2 may be also be provided.

The solutions provided by the embodiments of the present disclosure may include the following beneficial effects.

In the above embodiments, when the supporting sheet 1 included in the hinge structure 100 is in the unfolded, flattened state, the supporting sheet 1 may be maintained in the unfolded, flattened state by the force generated by the flattening support 3, which is parallel to the plane where the supporting sheet 1 is located, to prevent the supporting sheet 1 from being switched to the feedback state under a weak external action, which is beneficial to maintain the hinge structure 100 in the target state that the user desires.

Figure 2:
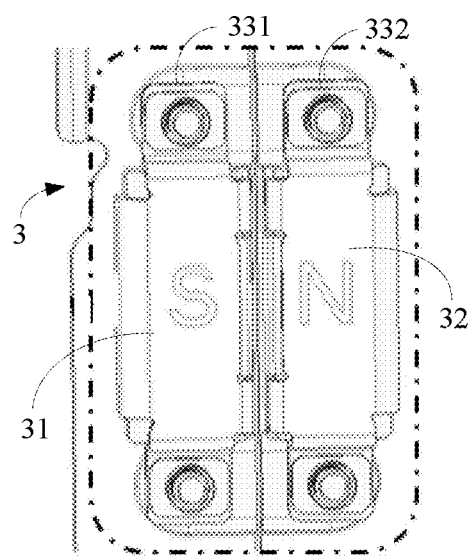
FIG. 2 is a schematic diagram of a flattening support according to some embodiments of the disclosure.
Figure 3:
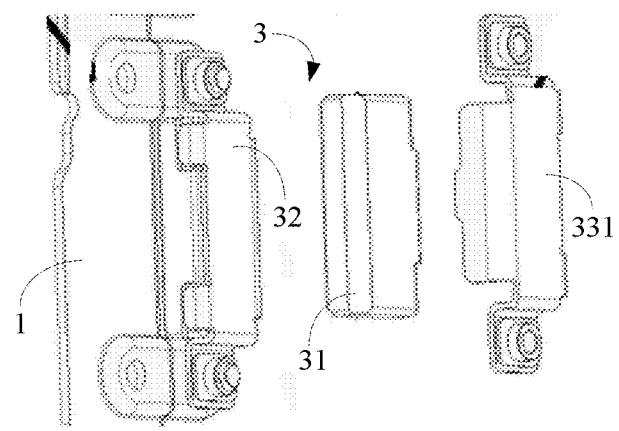
FIG. 3 is a partial exploded diagram of a flattening support according to some embodiments of the disclosure.
Figure 4:
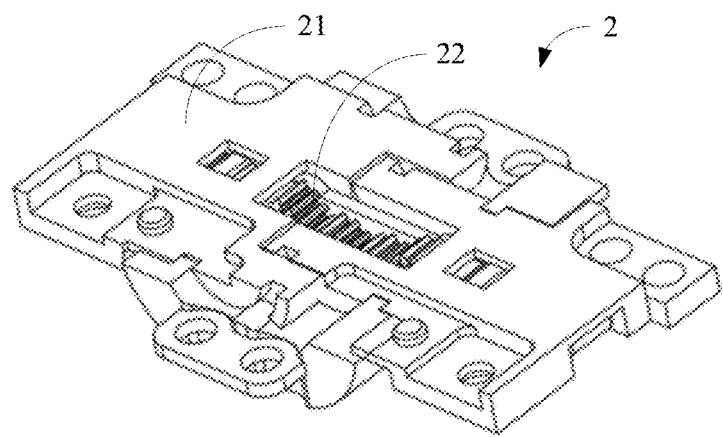
FIG. 4 is a schematic diagram of a first hinge after being unfolded according to some embodiments of the disclosure.
Figure 5:
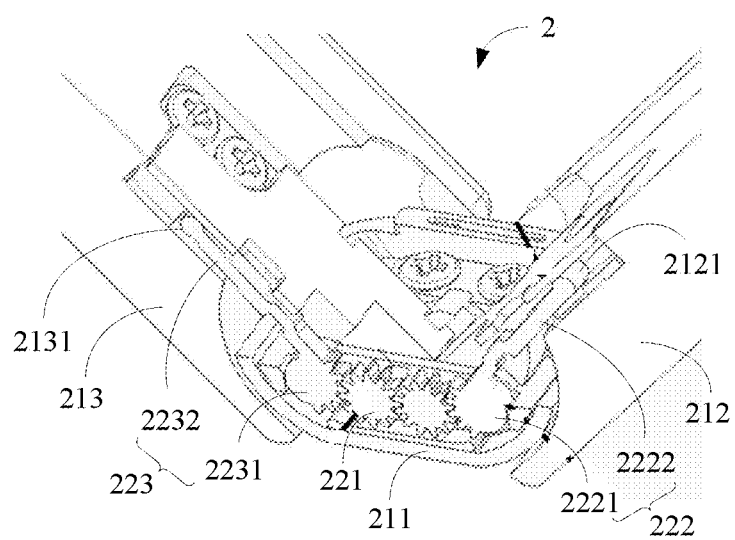
FIG. 5 is a schematic diagram of the first hinge in FIG. 4 after being folded, according to some embodiments of the disclosure.
Figure 6:
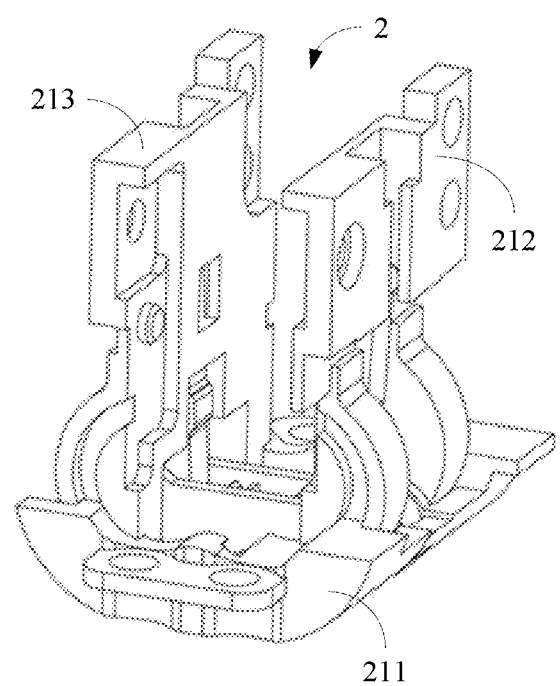
FIG. 6 is another schematic diagram of the first hinge in FIG. 4 after being folded, according to some embodiments of the disclosure.

In an embodiment, as shown in FIGS. 2 and 3, the flattening bracket 33 may include a first flattening bracket 331 and a second flattening bracket 332. The first flattening bracket 331 is connected to the first support 31 and the second flattening bracket 332 is connected to the second support 32. The purpose is to make the first flattening bracket 331 and the second flattening bracket 332 to adapt to the change of the relative positional relationship between the first support 31 and the second support 32. In an embodiment, as shown in FIGS. 2 and 3, the first flattening bracket 331 and the second flattening bracket 332 may be two brackets independent of each other, and each move as the state of the supporting sheet 1 on respective side changes. When the first flattening bracket 331 and the second flattening bracket 332 are in an unfolded, flattened state, the first support 31 and the second support 32 generate a force to maintain the supporting sheet 1 in the unfolded, flattened state. In another embodiment, the first flattening bracket 331 and the second flattening bracket 332 are rotatably connected to each other, and the relative positional relationship between the first flattening bracket 331 and the second flattening bracket 332 can be changed with the movement of the supporting sheet 1.

In the above embodiments, each of the first support 31 and the second support 32 may include a magnet. When the first supporting sheet 1 is in the unfolded, flattened state, the polarity of one side surface of the first support 31 is different from that of one side surface of the second support 32, and the two side surfaces with different polarities are arranged to be opposite to each other to generate a force between the first support 31 and the second support 32 by the principle of the polarity of the magnet. For instance, also shown in FIGS. 2 and 3, when the supporting sheet 1 is in the unfolded, flattened state, the side of the first support 31 arranged toward the second support 32 provides a south pole, and the side of the second support 32 arranged toward the first support 31 provides a north pole. In the embodiment, obtaining a force of the supporting sheet 1 in the unfolded, flattened state by a magnet set is different from the way of snapping or contact friction, and there is no wear and tear caused by friction. When the south pole of the first support 31 and the north pole of the second support 32 are arranged to be opposite to each other, the force between the first support 31 and the second support 32 is large. If there is no external force or the external force is small, the interaction force between the first support 31 and the second support 32 can maintain the current positional relationship and avoid shaking.

In another embodiment, one of the first support 31 and the second support 32 may include a magnet, and the other of the first support and the second support may include an electromagnetic coil. When the electromagnetic coil is in an energized state, the magnetic field generated by the electromagnetic coil can interact with the magnet to generate a force which maintains the supporting sheet 1 in the unfolded, flattened state. For example, the first support 31 may include a magnet and the second support 32 may include an electromagnetic coil. The state of the supporting sheet 1 may be determined by acquiring the state of the first hinge 1. When it is determined that the supporting sheet 1 is in the unfolded, flattened state, the second support member 32 may be energized to generate a force which maintains the supporting sheet 1 in the unfolded, flattened state. When an external force for changing the state of the first hinge 1 is detected, the second support 32 may be de-energized in order to change the state of the supporting sheet 1.

In the above embodiments, as shown in FIG. 1, the supporting sheet 1 may include a first supporting sheet 11 and a second supporting sheet 12, and each of the first supporting sheet and the second supporting sheet is connected to the first hinge 2. When the surfaces of first supporting sheet 11 and of the second supporting sheet 12 facing the same side are in the same plane, the supporting sheet 1 is switched to the unfolded, flattened state as a whole. When the angle between the surfaces of the first sheet 11 and of the second sheet 12 facing the same side is greater than or equal to 0° and less than 180°, the supporting sheet 1 is in the folded state. The non-zero angle may be equal to 30°, 50°, 60°, 90°, 120°, 150° etc., which is not limited in the present disclosure.

Other examples of the hinge structure 100 will be described below. As shown in FIGS. 4-8, the first hinge 2 may include a trajectory limiting mechanism 21 and a synchronization mechanism 22. The trajectory limiting mechanism 21 may be configured to limit a rotation direction of the first hinge 2 and the synchronization mechanism 22 may be configured to allow the rotation of the first hinge 2. For example, the trajectory limiting mechanism 21 may include a first hinge bracket 211, a first slider 212, and a second slider 213. The first hinge bracket 211 may be connected to a casing of the electronic device equipped with the hinge structure 100. For example, the first hinge bracket 211 may be fixedly connected to the casing of the electronic device by screws or bolts, or may be fixed to the casing of the electronic device by welding, which is not limited in the present disclosure.

The first slider 212 may include a first hollow sliding slot 2121 and the second slider 213 may include a second hollow sliding slot 2131. For example, the first slider 212 and the second slider 213 may be made hollow to obtain corresponding hollow sliding slots. The synchronization mechanism 22 may include a cylindrical gear set 221, a first guide rod gear 222, and a second guide rod gear 223. The first guide rod gear 222 may include a gear end 2221 and a guide rod end 2222. Similarly, the second guide rod gear 223 may include a corresponding gear end 2231 and a corresponding guide rod end 2232. The gear end 2221 of the first guide rod gear 222 engages with an end gear of the cylindrical gear set 221, and the gear end 2231 of the second guide rod gear 223 engages with another end gear of the cylindrical gear set 221. The guide rod end 2222 of the first guide rod gear 222 cooperates with the first hollow sliding slot 2121, and the guide rod end 2232 of the second guide rod gear 223 cooperates with the second hollow sliding slot 2131.

In this way, when the external force acts on the electronic device equipped with the hinge structure 100 and is further transmitted to the first slider 212, the guide rod end 2222 of the first guide rod gear 222 may slide in the first hollow sliding slot 2121, the gear end 2221 may transmit the power to the cylindrical gear set 221 and further to the gear end 2231 of the second guide rod gear 223, thereby driving the guide rod end 2232 of the second guide rod gear 223 to slide in the second hollow slide slot 2131. The restriction of the first hollow sliding slot 2121 and the second hollow sliding slot 2131 may allow the first hinge 2 to be switched between the state shown in FIG. 4, the state shown in FIG. 5 and the state shown in FIG. 6, or switched between the state shown in FIG. 7 and the state shown in FIG. 8. For example, it may allow the angle of each of the first slider 212 and the second slider 213 relative to the first hinge bracket 211 at the same time to be substantially the same (that is, the difference between the angle of the first slider 212 relative to the second slider 211 and the angle of the second slider 213 relative to the first hinge bracket 211 is small, and is within the allowable range), thereby basically realizing the synchronized movement of the first slider 212 and the second slider 213. Here, only the force acting on the first slider 212 is taken as an example for description, reference may be made to the above embodiments when the force is transmitted to the second slider 213, or to the first slider 212 and the second slider 213.

In the above embodiments, the cylindrical gear set 221 allows the transmission of power from the first slider 212 to the second slider 213 or from the second slider 213 to the first slider 212 substantially in a straight line. Therefore, when the first slider 212 and the second slider 213 are arranged immediately opposite to each other, cooperation of the cylindrical gear set 221, the first guide rod gear 222 and the second guide rod gear 223 drive each of the first slider 212 and the second slider 213 into rotation relative to the first hinge bracket 211. This can avoid the torque generated in the synchronization mechanism 22 and the trajectory limiting mechanism 21 due to the misalignment of the first slider 212 and the second slider 213, thereby prolonging the service life of the hinge structure 100.

Figure 9:
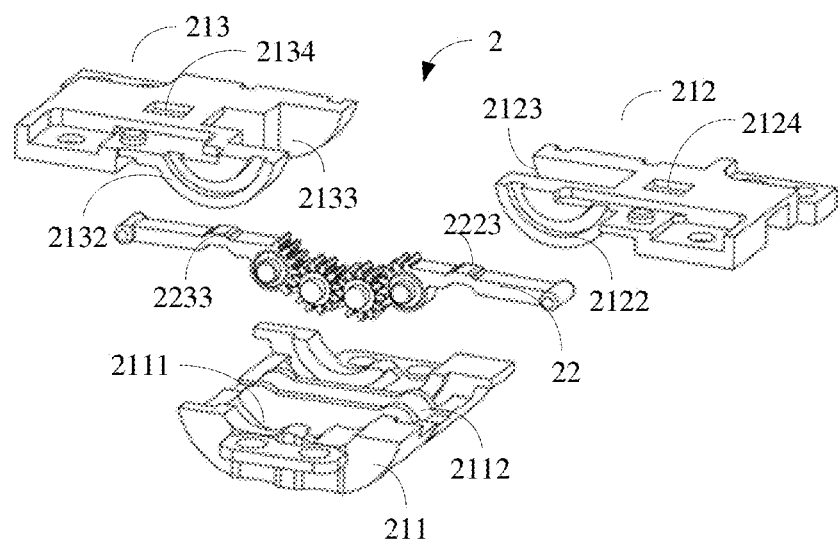
FIG. 9 is an exploded schematic diagram of a first hinge according to some embodiments of the disclosure.

In the embodiment, in order to allow the rotation of each of the first slider 212 and the second slider 213 relative to the first hinge bracket 211, as shown in FIG. 9, the first hinge bracket 211 may include a first arc guiding portion 2111, the first slider 212 may include a first arc portion 2122, the second slider 213 may include a second arc portion 2132, and each of the first arc portion 2122 and the second arc portion 2132 cooperates with the first arc guiding portion 2111. For example, the outer arc surfaces of the first arc portion 2122 and of the second arc portion 2132 are in contact with the arc surface of the first arc guiding portion 2111 facing the first slider 212 and the second slider 213. Therefore, when the synchronization mechanism 22 rotates, the first arc portion 2122 and the second arc portion 2132 rotate under the restriction of the first arc guiding portion 2111, so that the movement trajectory of the first slider 212 and the second slider 213 is constant. The lateral rounded corner of the hinge structure 100 after being folded is determined by the first arc guiding portion 2111. The rounded corner of the first arc guide 2111 is a fixed value, thereby ensuring the lateral rounded corner of the hinge structure 100 after being folded is constant, which is beneficial to reduce the damage to the screen of the foldable electronic device.

Figure 10:
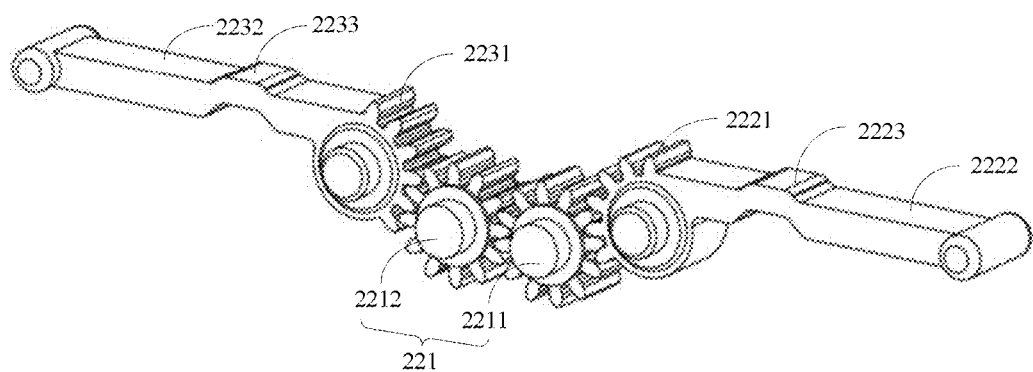
FIG. 10 is a schematic diagram of a synchronization mechanism according to some embodiments of the disclosure.
Figure 11:
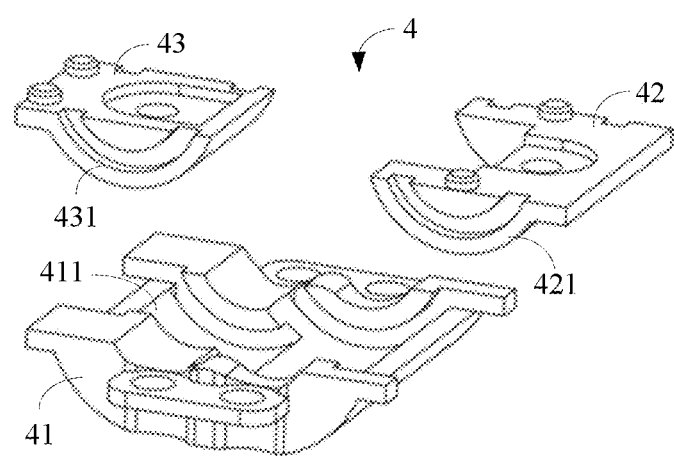
FIG. 11 is an exploded schematic diagram of a second hinge according to some embodiments of the disclosure.
Figure 12:
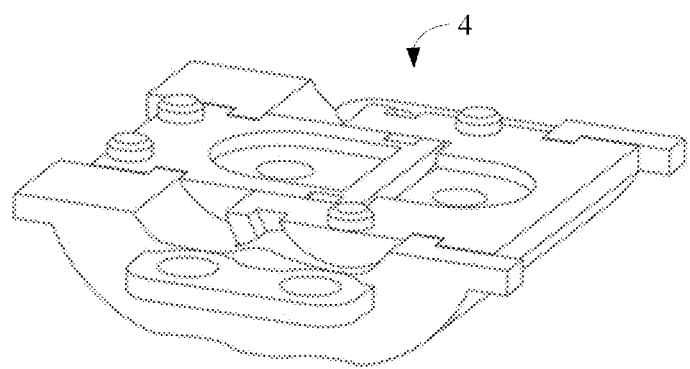
FIG. 12 is a schematic diagram of a second hinge after being unfolded, according to some embodiments of the disclosure.
Figure 13:
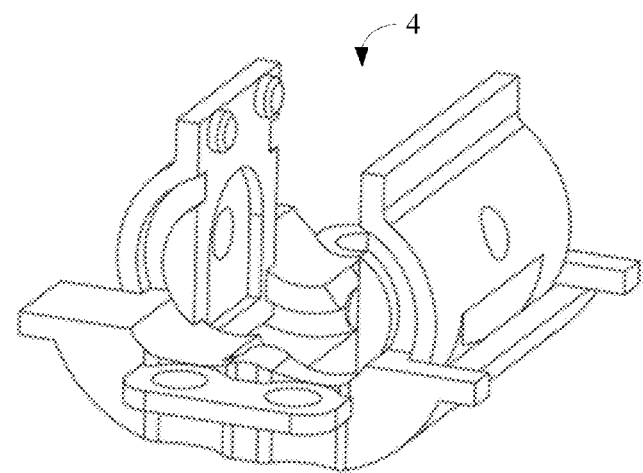
FIG. 13 is a schematic diagram of the second hinge in FIG. 12 after being folded, according to some embodiments of the disclosure.

In an embodiment, in order to reduce the thickness of the first hinge 2, as shown in FIG. 9 and FIG. 10, the first hinge bracket 211 may further include two upright blocks 2112 extending upward from the bottom surface of the first arc guiding portion 2111. There may be a certain spacing distance between the two upright blocks 211, so that the gear end 2221 of the first guide rod gear 222, the gear end 2231 of the second guide rod gear 223, and the cylindrical gear set 221 are arranged between the two upright blocks 2112. The area, which is located between the two vertical blocks 2112, on the bottom surface of the first arc guiding portion 2111, may be adaptively designed for the gear end 2221 of the first guide rod gear 222, the gear end 2231 of the second guide rod gear 223, and the cylindrical gear set 221, which is not limited in the present disclosure.

In the embodiment, since there is an escape portion 2112 formed by the upright blocks within the first arc guiding portion 2111, in order to escape the escape portion 2112, the first slider 212 may include a first recessed portion 2123 recessed in the length direction of the first hollow sliding slot 2121, and the second slider 213 may include a second recessed portion 2133 recessed in the length direction of the second hollow sliding slot 2131. The first recessed portion 2123 and the second recessed portion 2133 may give way to the escape portion 2112. Furthermore, as shown in FIG. 9, in order to shorten the size of the first hinge 2 in the length direction of the first hollow sliding slot 2121 and the second hollow sliding slot 2131, a part of the first arc portion 2122 included in the first slider 212 may be located in the second recessed portion 2133; or in other embodiments, a part of the second arc portion 2132 included in the second slider 23 may be located in the first recessed portion 2123, which is not limited in the present disclosure.

In the above embodiments, still taking FIG. 9 as an example, the first slider 212 may further include a first through portion 2124 through which the first hollow sliding slot 2121 may open into the outside. Similarly, the second slider 213 may further include a second through portion 2134 through which the second hollow sliding slot 2131 may open into the outside. The first guide rod gear 222 may further include a first protrusion portion 2223, and the second guide rod gear 223 may further include a second protrusion portion 2233. A part of the first protrusion portion 2223 protrudes into the first through portion 2124, and a part of the second protrusion portion 2233 protrudes into the second through portion 2134. In this way, when the hinge structure 100 is fully unfolded, the first protrusion portion 2223 may be restricted by the side of the first through portion 2124 adjacent to the first recessed portion 2123, and the second protrusion portion 2233 may be restricted by the side of the second through portion 2134 adjacent to the second recessed portion 2133; when the hinge structure 100 is fully folded, the first protrusion portion 2223 may be restricted by the side of the first through portion 2124 away from the first recessed portion 2123, and the second protrusion portion 2233 may be restricted by the side of the second through portion 2134 away from the second recessed portion 2133, thereby preventing the hinge structure 100 from being excessively unfolded or excessively folded.

In an embodiment, as shown in FIG. 10, each of an end of the guide rod end 2222 of the first guide rod gear 222 and an end of the guide rod end 2232 of the second guide rod gear 223 may be arranged to be cylindrical, to reduce the frictional force of the guide rod end 2222 of the first guide rod gear 222 sliding in the first hollow sliding slot 2121 and the frictional force of the guide rod end 2232 of the second guide rod gear 223 sliding in the second hollow slide slot 2131, thereby improving the user experience.

Figure 7:
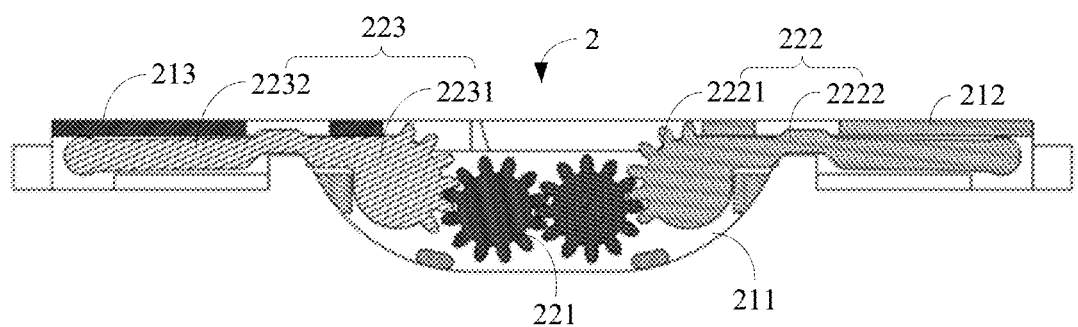
FIG. 7 is a schematic diagram of another first hinge after being unfolded according to some embodiments of the disclosure.
Figure 8:
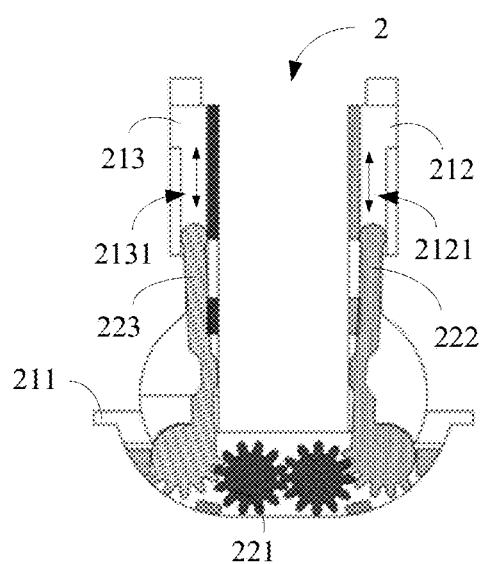
FIG. 8 is a schematic diagram of the first hinge in FIG. 7 after being folded, according to some embodiments of the disclosure.

The cylindrical gear set 221 in FIG. 7 will be further described. As shown in FIG. 10, the cylindrical gear set 221 may include a first gear 2211 and a second gear 2212 engaged with each other. The first gear 2211 is engaged with the gear end 2221 of the first guide rod gear 222, and the second gear 2212 is engaged with the gear end 2231 of the second guide rod gear 223, to reduce the number of engaging points of gears as much as possible, which is beneficial to reduce the cumulative tolerance, thereby reducing the delay between the rotation of the first slider 212 and the rotation of the second slider 213, and improving the synchronization efficiency and the folding efficiency when the hinge structure 100 is folded.

In some embodiments, as shown in FIGS. 11-14, the hinge structure 100 may further include a second hinge 4, and the second hinge 4 may include a second hinge bracket 41, a third slider 42 and a fourth slider 43. Each of the third slider 42 and the fourth slider 43 is connected to the supporting sheet. The second hinge bracket 41 may further include a second arc guiding portion 411, the third slider 42 may include a third arc portion 421, and the fourth slider 43 may include a fourth arc portion 431. Each of the third arc portion 421 and the fourth arc portion 431 cooperates with the second arc guiding portion 411, so that when the movement of the first hinge 2 is transmitted to the second hinge 4, each of the third arc portion 421 and the fourth arc portion 431 is driven into rotation relative to the second arc guiding portion 411 and the second hinge 4 is switched between the state shown in FIG. 12 and the state shown in FIG. 13. The outer round corners of the second arc guiding portion 411 may be equal to the outer round corners of the first arc guiding portion 2111, to improve the aesthetics of the hinge structure 100. For other structures of the second hinge 4, reference may be made to the trajectory limiting mechanism 21 of the first hinge 2, which will not be repeated here.

Figure 14:
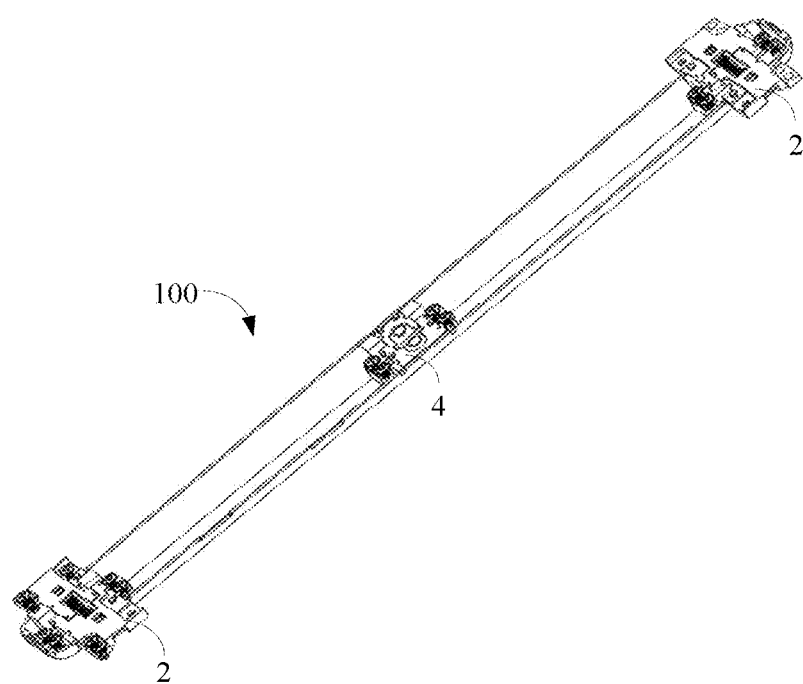
FIG. 14 is a schematic diagram of a hinge structure according to some embodiments of the disclosure.

As shown in FIG. 14, the first hinge 2 and the second hinge 4 may be included in the same hinge structure 100. Taking FIG. 14 as an example, assuming that the hinge structure 100 includes one second hinge 4 and two first hinges 2, since the first hinge 2 may limit the folding trajectory of the hinge structure 100, the two first hinges 2 may be arranged at the ends of the hinge structure 100, and the second hinge 4 may be arranged between the two first hinges 2, thereby simplifying the structure while meeting the folding requirements. Of course, here only the same hinge structure 100 including two first hinges 2 and one second hinge 4 is taken as an example. In other embodiments, the hinge structure 100 may also include other numbers of first hinges 2 and the second hinge 4, which is not limited in this disclosure.

Figure 15:
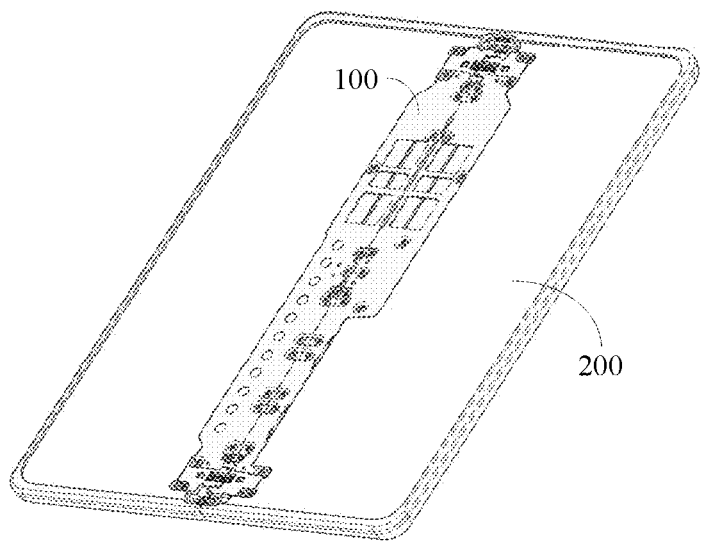
FIG. 15 is a schematic diagram of a hinge structure and a middle frame in an assembled state according to some embodiments of the disclosure.
Figure 16:
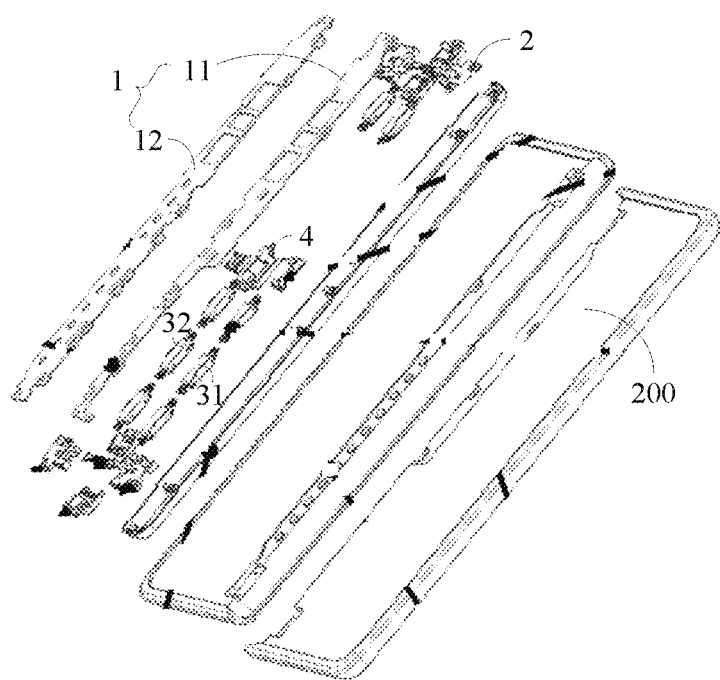
FIG. 16 is a schematic diagram of a hinge structure and a middle frame in a disassembled state according to some embodiments of the disclosure.

FIGS. 15 and 16 are schematic diagrams of a foldable electronic device according to some embodiments. The electronic device may include a middle frame 200 and the hinge structure 100 described above. The supporting sheet 1 of the hinge structure 100 is connected to the middle frame 200. Each of the first slider 212 and the second slider 213 of the first hinge 2 and each of the third slider 42 and the fourth slider 43 of the second hinge 4 are connected to the supporting sheet 1, and the supporting sheet 1 is connected to the middle frame 200. The supporting sheet 1 is driven to move by the first hinge 2 and the second hinge 4, so that the supporting sheet 1 may drive the middle frame 200 to switch between the unfolded, flattened state and the folded state. For example, the supporting sheet may drive the middle frame 200 to be folded from top to bottom as shown in FIG. 15, or to be folded from bottom to top. The electronic device may include a holding terminal or an electronic reader, which is not limited in the present disclosure.

Other embodiments of the present disclosure will readily occur to those skilled in the art from consideration of the specification and practice disclosed herein. The present disclosure is intended to cover any variations, uses, or adaptations of the present disclosure following the general principles of the present disclosure and including common knowledge or conventional technical means in the technical field that are not disclosed in this disclosure. The specification and embodiments are to be considered as exemplary only, and the true scope and spirit of the present disclosure are indicated by the following claims.

It should be understood that the present disclosure is not limited to the precise structures that have been described above and shown in the drawings, and various modifications and changes can be made without departing from the scope thereof. The scope of the present disclosure is limited only by the appended claims.

What is claimed is:

1. A hinge structure, comprising:
   a supporting sheet having an unfolded, flattened state and a folded state;
   at least one first hinge connected to the supporting sheet, the at least one first hinge being configured to drive the supporting sheet to switch between the unfolded, flattened state and the folded state; and
   at least one flattening support comprising a first support, a second support, and a flattening bracket, the flattening bracket being connected to the first support and the second support, and the flattening bracket being connected to the supporting sheet;
   wherein when the supporting sheet is in the unfolded, flattened state, the first support and the second support interact with each other and generate a force parallel to a plane where the supporting sheet is located, to maintain the supporting sheet in the unfolded, flattened state,
   wherein the supporting sheet comprises a first supporting sheet and a second supporting sheet, each of the first supporting sheet and the second supporting sheet being connected to the at least one first hinge,
   wherein the at least one first hinge comprises:
   a trajectory limiting mechanism comprising a first hinge bracket, a first slider connected to the first supporting sheet, and a second slider connected to the second supporting sheet, the first slider comprising a first hollow sliding slot and the second slider comprising a second hollow sliding slot; and
   a synchronization mechanism comprising a cylindrical gear set, a first guide rod gear, and a second guide rod gear, each of the first guide rod gear and the second guide rod gear comprising a gear end and a guide rod end, the gear end of the first guide rod gear engaging with a first end gear of the cylindrical gear set, and the gear end of the second guide rod gear engaging with a second end gear of the cylindrical gear set, the guide rod end of the first guide rod gear slidably cooperating with the first hollow sliding slot and the second guide rod end slidably cooperating with the second hollow sliding slot to drive each of the first slider and the second slider into rotation relative to the first hinge bracket.

2. The hinge structure of claim 1, wherein the flattening bracket comprises a first flattening bracket and a second flattening bracket separated from each other, the first flattening bracket being connected to the first support, the second flattening bracket being connected to the second support.

3. The hinge structure of claim 1, wherein the flattening bracket comprises a first flattening bracket and a second flattening bracket rotatably connected to each other, the first flattening bracket being connected to the first support, the second flattening bracket being connected to the second support.

4. The hinge structure of claim 1, wherein each of the first support and the second support comprises a magnet, polarity of one side surface of the first support is different from that of one side surface of the second support, and when the supporting sheet is in the unfolded, flattened state, the side surface of the first support and the side surface of the second support with different polarities are arranged to be opposite to each other.

5. The hinge structure of claim 1, wherein one of the first support and the second support comprises a magnet, and the other one of the first support and the second support comprises an electromagnetic coil;
   wherein when the supporting sheet is in the unfolded, flattened state, the electromagnetic coil is in an energized state, to interact with the magnet to generate a force to maintain the supporting sheet in the unfolded, flattened state.

6. The hinge structure of claim 1,
   wherein when surfaces of the first supporting sheet and the second supporting sheet facing a same side are in a same plane, the supporting sheet is switched to the unfolded, flattened state, and when an angle is formed between the surfaces of the first sheet and the second sheet facing the same side, the supporting sheet is in the folded state, the angle being greater than or equal to 0° and less than 180°.

7. The hinge structure of claim 1, wherein the first hinge bracket comprises a first arc guiding portion, the first slider comprising a first arc portion and the second slider comprising a second arc portion, each of the first arc portion and the second arc portion cooperating with the first arc guiding portion.

8. The hinge structure of claim 7, wherein the first hinge bracket further comprises two upright blocks extending upward from a bottom surface of the first arc guiding portion;
   the gear end of the first guide rod gear, the gear end of the second guide rod gear, and the cylindrical gear set being located between the two upright blocks.

9. The hinge structure of claim 8, wherein the first slider comprises a first recessed portion recessed in a length direction of the first hollow sliding slot, the second slider comprising a second recessed portion recessed in a length direction of the second hollow sliding slot, each of the first recessed portion and the second recessed portion being configured to escape the two upright blocks.

10. The hinge structure of claim 9, wherein at least a part of the second arc portion is located in the first recessed portion;
   or at least a part of the first arc portion is located in the second recessed portion.

11. The hinge structure of claim 1, wherein
   the first slider further comprises a first through portion, the first hollow sliding slot opening into the outside of the first slider through the first through portion;
   the second slider further comprises a second through portion, the second hollow sliding slot opening into the outside of the second slider through the second through portion; and
   the first guide rod gear comprises a first protrusion portion, the second guide rod gear comprising a second protrusion portion, a part of the first protrusion portion protruding into the first through portion, a part of the second protrusion portion protruding into the second through portion.

12. The hinge structure of claim 1, wherein the hinge structure further comprises a second hinge, the second hinge comprising a second hinge bracket, a third slider and a fourth slider, each of the third slider and the fourth slider being connected to the supporting sheet, the second hinge bracket comprising a second arc guiding portion;
   the third slider comprises a third arc portion, the fourth slider comprising a fourth arc portion, each of the third arc portion and the fourth arc portion cooperating with the second arc guiding portion.

13. The hinge structure of claim 12, wherein the hinge structure comprises two first hinges and one second hinge, the second hinge being located between the two first hinges.

14. The hinge structure of claim 1, wherein the cylindrical gear set comprises a first gear and a second gear engaged with each other, the first gear being engaged with the gear end of the first guide rod gear, the second gear being meshed with the gear end of the second guide rod gear.

15. The hinge structure of claim 1, wherein each of an end of the guide rod end of the first guide rod gear and an end of the guide rod end of the second guide rod gear is arranged to be cylindrical.

16. A hinge structure, comprising:
a supporting sheet having an unfolded, flattened state and a folded state;
two first hinges connected to the supporting sheet, one first hinge being provided at each of two ends of the hinge structure in a length direction of the supporting sheet, the two first hinges being configured to drive the supporting sheet to switch between the unfolded, flattened state and the folded state; and
at least one flattening support located between the two first hinges, the at least one flattening support comprising a first support, a second support, and a flattening bracket, the flattening bracket being connected to the first support and the second support, and the flattening bracket being connected to the supporting sheet;
wherein when the supporting sheet is in the unfolded, flattened state, the first support and the second support interact with each other and generate a force parallel to a plane where the supporting sheet is located, to maintain the supporting sheet in the unfolded, flattened state.

17. A foldable electronic device, comprising:
a hinge structure; and
a middle frame,
wherein the hinge structure comprises:
  a supporting sheet having an unfolded, flattened state and a folded state;
  at least one first hinge connected to the supporting sheet, the at least one first hinge being configured to drive the supporting sheet to switch between the unfolded, flattened state and the folded state; and
  at least one flattening support comprising a first support, a second support, and a flattening bracket, the flattening bracket being connected to the first support and the second support, and the flattening bracket being connected to the supporting sheet;
wherein when the supporting sheet is in the unfolded, flattened state, the first support and the second support interact with each other and generate a force parallel to a plane where the supporting sheet is located, to maintain the supporting sheet in the unfolded, flattened state; and
the middle frame is connected to the supporting sheet of the hinge structure, to switch a state of the middle frame in accordance with a switch of the state of the supporting sheet;
wherein the supporting sheet comprises a first supporting sheet and a second supporting sheet, each of the first supporting sheet and the second supporting sheet being connected to the at least one first hinge,
wherein the at least one first hinge comprises:
a trajectory limiting mechanism comprising a first hinge bracket, a first slider connected to the first supporting sheet, and a second slider connected to the second supporting sheet, the first slider comprising a first hollow sliding slot and the second slider comprising a second hollow sliding slot; and
a synchronization mechanism comprising a cylindrical gear set, a first guide rod gear, and a second guide rod gear, each of the first guide rod gear and the second guide rod gear comprising a gear end and a guide rod end, the gear end of the first guide rod gear engaging with a first end gear of the cylindrical gear set, and the gear end of the second guide rod gear engaging with a second end gear of the cylindrical gear set, the guide rod end of the first guide rod gear slidably cooperating with the first hollow sliding slot and the second guide rod end slidably cooperating with the second hollow sliding slot to drive each of the first slider and the second slider into rotation relative to the first hinge bracket.

\* \* \* \* \*